United States Patent [19]

Chuang

[11] 4,429,248

[45] Jan. 31, 1984

[54] MOUNTING APPARATUS AND METHOD FOR PIEZOELECTRIC TUNING FORK

[75] Inventor: Shih Chuang, Irvine, Calif.

[73] Assignee: Statek Corporation, Irvine, Calif.

[21] Appl. No.: 267,815

[22] Filed: May 27, 1981

[51] Int. Cl.³ .................................. H01L 41/08
[52] U.S. Cl. ............................ 310/370; 310/348
[58] Field of Search .................. 310/370, 348, 312

[56] References Cited

U.S. PATENT DOCUMENTS

| 3,683,213 | 8/1972 | Staudte | 310/370 X |
| 3,969,640 | 7/1976 | Staudte | 310/370 X |

*Primary Examiner*—Mark O. Budd

*Attorney, Agent, or Firm*—Pollock, Vande Sande & Priddy

[57] ABSTRACT

An improved mounting apparatus and method for a piezoelectric tuning fork (10) of the type made from a rectangular plate of quartz or similar material, the fork having a stem portion (12) and a pair of tines (14, 16) extending from the stem and defining between them a crotch (18) where they join the stem. The stem is supported on a pedestal (20-36) in such a way that the forwardmost edge (38) of the pedestal is spaced a distance d (in mils) having a magnitude in the range of 2565n/f to 3135n/f, where n is an integer and f is the fundamental frequency of the tuning fork in kilohertz. Improved suppression of overtone components is achieved during operation in the fundamental mode.

4 Claims, 5 Drawing Figures

MOUNTING APPARATUS AND METHOD FOR PIEZOELECTRIC TUNING FORK

DESCRIPTION

1. Technical Field

The present invention relates in general to microresonators of the tuning fork configuration and in particular to quartz tuning forks. The crotch between the tines of such a tuning fork is spaced at a particular distance from the forward edge of the pedestal supporting the fork whereby overtone components are suppressed during operation of the tuning fork in its fundamental mode.

2. Background Art

Piezoelectric microresonators such as quartz tuning forks have been used for a number of years to provide very accurate, high frequency signal sources for use in applications where an accurate high frequency signal source is required, such as in time measuring equipment; and more recently in transducers where the frequency of the microresonator changes as a function of temperature, pressure or other ambient conditions. For example, U.S. Pat. Nos. 3,488,530; 3,683,213 and 3,969,640 issued to Juergen H. Staudte disclose various types of microresonators of the quartz tuning fork configuration. U.S. Pat. No. 3,969,641, issued to Oguchi et al, also discloses various types of quartz tuning forks.

In most applications, such prior art tuning forks have been driven by an oscillator circut in such a way that the fork vibrates at its fundamental frequency. Depending upon the geometry of the stem and tines of the fork, the geometry of the electrodes applied to the fork, the design of the oscillator circuit and similar factors, first, second and even higher overtone components may appear in the output signal from the tuning fork. In many applications, the presence of such overtone components is undesirable; therefore, various efforts have been made to suppress them. Typically, suppression has been achieved to some degree by modifying the geometry of the electrodes, by changing the oscillator circuitry, or both. While such techniques have achieved some success, the presence of undesirable overtone components has continued to be a problem.

DISCLOSURE OF THE INVENTION

The primary object of the present invention is to provide an improved mounting system and method for quartz tuning forks which enhances suppression of overtone components during operation of the tuning fork at its fundamental frequency.

A further object of the invention is to provide such an improved mounting system and method which can be used to attach tuning forks to support pedestals having a variety of geometries.

These objects of the invention are given only by way of example; thus, other desirable objectives and advantages inherently achieved by the disclosed invention may occur or become apparent to those skilled in the art. Nonetheless, the scope of the invention is to be limited only by the appended claims.

In a preferred embodiment of the invention, a microresonator is provided of the type comprising a pedestal having a forward edge and at least one upper support surface. A flexural mode quartz tuning fork is supported by the pedestal by attachment of the rearward portion of the stem of the tuning fork to the support surface of the pedestal. A pair of tines extend from the forward portion of the stem and define between them a slot which terminates in a crotch where the tines join the stem. To suppress overtone components when the tuning fork is operated at its fundamental frequency, the crotch of the tuning fork is positioned at one of several distinct locations spaced from the forward edge of the pedestal. Preferably, the stem includes a forward extension past the edge of the pedestal to the location of the crotch, this forward extension having a length d in the range of $2565n/f$ to $3135n/f$, where d is the shortest distance (in mils) from the forward edge of the pedestal to the crotch; n is an integer (1,2,3, . . . ); and f is the fundamental frequency of the tuning fork in kilohertz. Quartz tuning forks mounted in this manner exhibit enhanced suppression of overtone components when the overall length of the tuning fork is in the range of 100 to 500 mils; the overall width of the tuning fork is in the range of 15 to 70 mils; the thickness of the tuning fork is as much as 30 mils; the tines of the tuning fork have a length in the range of 30 to 250 mils; and the width of the tines is in the range of 5 to 30 mils.

BEST MODE FOR CARRYING OUT THE INVENTION

Figure 1:
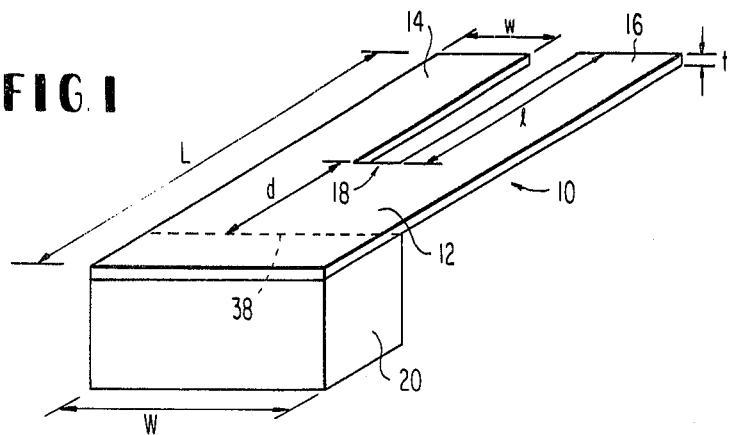
FIG. 1 shows a perspective view of a flat piezoelectric tuning fork and support pedestal of the general type used in the present invention.

The following is a detailed description of the preferred embodiments of the invention, reference being made to the drawing in which like reference numerals identify like elements of structure in each of the several figures.

FIG. 1 shows a perspective view of a flat piezoelectric tuning fork 10 which may be manufactured using microphotolithographic processes from a quartz plate or wafer. Preferably, the wafer is cut from a crystal of pure quartz so that the crystallographic axes of the wafer are designated (ZYw1)−25° to +25°/−35° to +35° or (XYt1)−25° to +25°/−55° to +55°, following standard nomenclature set forth in IEEE Standard No. 176-1978, entitled *IEEE Standard on Piezoelectricity*. Tuning forks mounted in accordance with the present invention may have an overall length L of 100 to 500 mils, an overall width W of 15 to 50 mils and a thickness t of up to 30 mils. Fork 10 comprises an essentially rectangular stem 12 from the forward portion of which extend a pair of parallel rectangular tines 14, 16, each tine having a width w in the range of 5 to 30 mils and a length 1 of from 30 to 250 mils, measured from crotch 18 between the tines. In a typical application, the rearward portion of stem 12 is mounted on a suitable monolithic pedestal 20 having an upper support surface which may include metallized conductors for connection to the electrodes of the fork. Those skilled in the art will appreciate that various electrode geometries may be used for operation in the fundamental mode, such as those shown in the previously mentioned U.S. Pat. No. 3,683,213.

Figure 2:
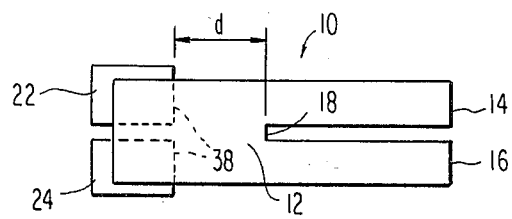
FIGS. 2–5 show top views of the same type of tuning fork shown in FIG. 1 as mounted on support pedestals having different geometries.
Figure 3:
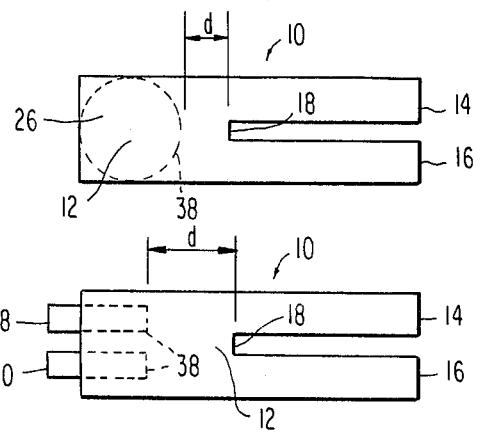
Figure 4:
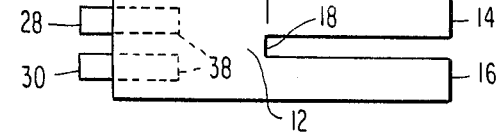
Figure 5:
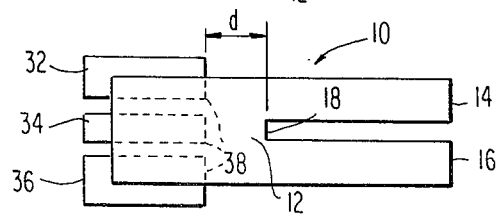

FIGS. 2 to 5 illustrate other mounting arrangements for fork 10 in which other pedestal geometries are used than that of monolithic pedestal 20. In FIG. 2, a pair of laterally spaced pedestals 22, 24 are positioned so that they extend beyond the sides and rearward end of stem 12. In FIG. 3, a pedestal 26 having a round configuration is used. In FIG. 4, pedestals 28, 30 extend only beyond the rearward end of stem portion 12. In FIG. 5, three laterally spaced pedestals 32, 34, 36 are used. Other pedestal geometries also may be used; however, it will be found in each case that the pedestal or the pedestals will have a forwardmost edge 38 which is spaced a certain distance d from crotch 18.

Applicant has discovered that this distance d, the forward extension in mils (thousandths of an inch) of stem 12 from edge 38 to crotch 18, has a surprising influence on the degree of suppression of overtone components achieved when fork 10 is operated at its fundamental frequency. More particularly, applicant has found that when distance d is defined by the relationship $$d = \frac{2850n(1 \pm 0.1)}{f},$$

where d is the shortest distance from edge 38 to crotch 18; n is an integer (1,2,3, ...) and f is the fundamental frequency of tuning fork 10 in kilohertz, then a substantial improvement in suppression of first overtone components is achieved. Alternatively, d may be said to be in the range of $$\frac{2565n}{f} \text{ to } \frac{3135n}{f}.$$

When tuning fork 10 is mounted in accordance with the present invention, it operates in a more truly fundamental mode due to the suppression of first overtone components.

For example, for a quartz fork having an overall length, an overall width, a thickness, a tine length and a tine width in the ranges previously mentioned and a fundamental frequency of 100 kHz, d would be in the range of 25.7 to 31.4 mils for n=1; 51.3 to 62.7 mils for n=2; and so forth.

INDUSTRIAL APPLICABILITY

The present invention has particular utility in microresonators for use in time-measuring devices and transducers of various sorts; however, those skilled in the art will appreciate that the invention may be applied to quartz timing forks for any application where suppression of overtone components is desired during operation at the fundamental frequency.

Having disclosed my invention in sufficient detail to enable those skilled in the art to make and use it, I claim:

1. A microresonator, comprising:
   a pedestal having a forward edge and at least one support surface;
   a flexural mode tuning fork having a stem with a forward means portion and a rearward portion, said forward means portion having a length d for suppressing overtone components when said tuning fork is operated at its fundamental frequency, a pair of tines extending forward from said forward means portion of said stem, a slot between said tines and a crotch at the base of said slot where said tines join said forward means portion of said stem, said rearward portion of said stem being positioned on said support surface of said pedestal to support said tuning fork and said length d of said forward means portion beginning at said forward edge of said pedestal and extending to said crotch.

2. A microresonator according to claim 1, wherein said tuning fork is quartz.

3. A microresonator, comprising:
   a pedestal having a forward edge and at least one support surface;
   a flexural mode quartz tuning fork having a stem with forward and rearward portions, said forward portion having a length d, and a pair of tines extending forward from said forward portion of said stem, a slot between said tines and a crotch at the base of said slot where said tines join said forward portion of said stem, said rearward portion of said stem being positioned on said support surface of said pedestal to support said tuning fork and said forward portion being extended past said forward edge of said pedestal, said length d of said forward portion from said crotch to said forward edge being in the range 2565n/f to 3135n/f, where d is the shortest distance from said forward edge to said crotch, n is an integer (1,2,3 ...) and f is the fundamental frequency of said quartz tuning fork in kHz.

4. A microresonator according to claim 3, wherein said tuning fork has an overall length in the range of 100 to 500 mils, an overall width in the range of 15 to 70 mils and a thickness of up to 30 mils; and said tines have a length in the range of 30 to 250 mils and a width in the range of 5 to 30 mils.

* * * * *